United States Patent [19]

Park et al.

[11] Patent Number: 5,418,186
[45] Date of Patent: May 23, 1995

[54] METHOD FOR MANUFACTURING A BUMP ON A SEMICONDUCTOR CHIP

[75] Inventors: Jong-han Park; Chun-geun Park, both of Kyungki-do; Seon-ho Ha, Seoul, all of Rep. of Korea

[73] Assignee: Samsung Electronics Co., Ltd., Kyungki-do, Rep. of Korea

[21] Appl. No.: 275,550

[22] Filed: Jul. 15, 1994

[30] Foreign Application Priority Data

Jul. 15, 1993 [KR] Rep. of Korea .................. 93-13346

[51] Int. Cl.⁶ .............................................. H01L 21/44
[52] U.S. Cl. .................................. 437/183; 437/182; 437/192; 437/203
[58] Field of Search ............... 437/183, 182, 184, 192, 437/193, 203

[56] References Cited

U.S. PATENT DOCUMENTS

| | | | |
|---|---|---|---|
| 4,948,754 | 8/1990 | Kondo et al. | 437/183 |
| 5,057,453 | 10/1991 | Endo et al. | 437/183 |
| 5,244,833 | 9/1993 | Gansauge et al. | 437/183 |
| 5,298,459 | 3/1994 | Arikawa et al. | 437/192 |
| 5,300,445 | 4/1994 | Oku | 437/203 |

FOREIGN PATENT DOCUMENTS

| | | | |
|---|---|---|---|
| 265140 | 3/1990 | Japan | 437/203 |
| 4120734 | 4/1992 | Japan | 437/183 |
| 4245436 | 9/1992 | Japan | 437/183 |

Primary Examiner—Brian E. Hearn
Assistant Examiner—Kevin M. Picardat
Attorney, Agent, or Firm—Stephen R. Whitt; Robert A. Westerlund; Charles R. Donohoe

[57] ABSTRACT

A method for manufacturing a bump on a semiconductor comprising the steps of: forming metal pad on a portion of a surface of a substrate, forming a barrier metal layer over the surface of the substrate such that the barrier metal layer cover the metal pad, forming a photoresist layer over the barrier metal layer, forming an opening in the photoresist layer to expose a portion of the barrier metal layer overlaying the metal pad, forming a chip bump in the opening, selectively removing the photoresist layer using the bump as a mask, such that residual portions of the photoresist layer remain, and such that portions of the barrier metal layer are exposed, etching the exposed portions of the barrier metal layer using the residual photoresist layer as a mask, and removing the residual photoresist layer.

14 Claims, 7 Drawing Sheets

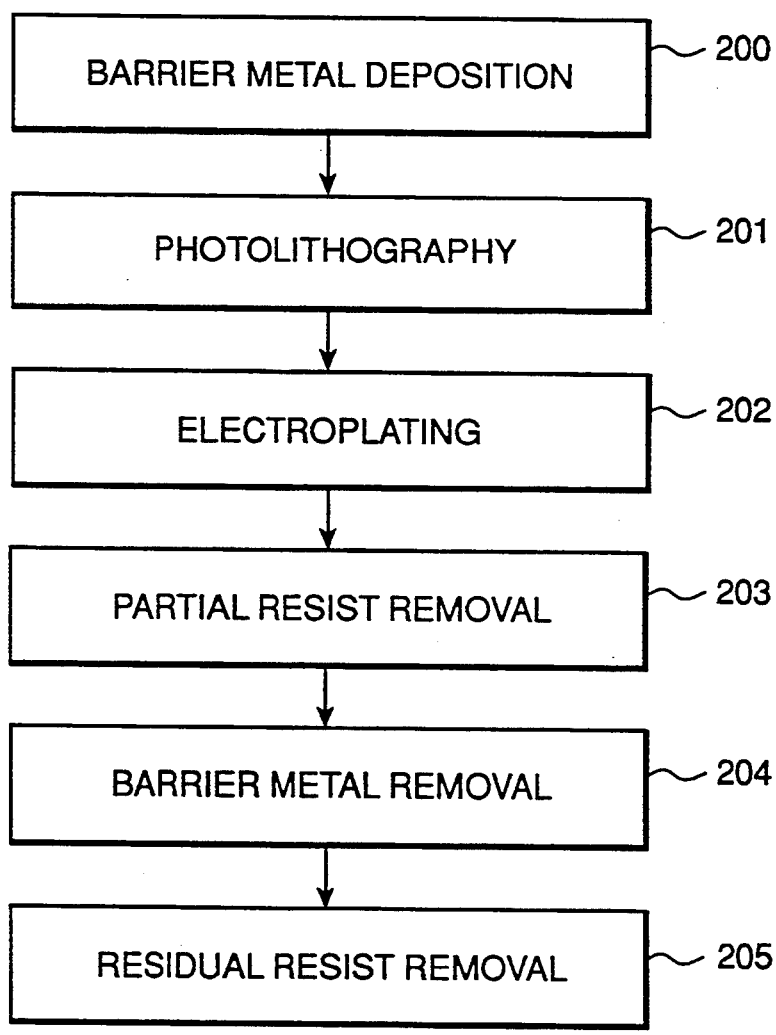

METHOD FOR MANUFACTURING A BUMP ON A SEMICONDUCTOR CHIP

BACKGROUND OF THE INVENTION

The present invention relates to a method for manufacturing a bump on a semiconductor device. More particularly, the present invention relates to a simplified method for manufacturing a chip bump, which enables optional selection of an etching method, as necessary, to remove a barrier metal from a predetermined region after bump formation.

With advancements in semiconductor manufacturing techniques, semiconductor devices have become more and more densely packaged. At the same time, the need for the miniaturization of electronic components and the need for improved operating speed have necessitated not only larger chips, but also smaller and thinner packages. These are, of course, conflicting requirements.

As a first step in an exemplary, conventional method for manufacturing a semiconductor device satisfying these requirements, a bump is formed on a metal pad on the semiconductor chip. A next step, a supporting lead of a lead frame is attached to the bump by a thermocompression method to thereby obtain an assembly. Two assemblies are positioned at the upper and lower side with the lead frame at the center position, and the supporting leads are bent and formed to connect to each lead frame. This connection is completed using resin.

Gold, copper or solder may be used as a material for manufacturing the bump. Among these, gold is the most desirable material due to its high conductivity and corrosion resistance. Recently, however, copper bumps and solder bumps have been used to achieve cost reduction. In the case of a solder bump, electroplating, evaporation, or dipping in a solder bath is used.

Several conventional methods for manufacturing a mushroom-type chip bump having a recessed lower portion have been suggested. Three such methods are illustrated in FIG. 1, FIG. 3 and FIG. 4, respectively. Among these, the method illustrated in FIG. 1 is the most widely applied. This method includes the steps of depositing a barrier metal layer (100), forming a first photoresist pattern using photolithography (101), electroplating a bump on the photoresist pattern (102), removing the photoresist (103), forming a second photoresist pattern over the bump (104), etching exposed portions of the barrier metal layer (105), removing the second photoresist pattern (106), and heat treating the resulting structure (107). The method of FIG. 1 will be described in greater detail by referring to FIGS. 2A through 2E.

Referring to FIG. 2A, in order to manufacture a bump, a barrier metal layer 5 is deposited on the surface of a substrate composed of a silicon layer 1, a silicon oxide layer 2, a metal layer (aluminum) 3, and a protective layer 4. As shown in FIG. 2B, a plating pattern is then formed by a photolithography process step using a first photoresist layer 6. A bump 7 is formed in the pattern by means of an electroplating process step on metal layer 3 using barrier metal layer 5 as one electrode. Referring to FIGS. 2C and 2D, after the unnecessary portion of first photoresist layer 6 is removed, and a second photoresist layer 11 is formed to cover the bump and the immediately surrounding area. Then, the exposed portions of barrier metal layer 5 are removed through etching. As shown in FIG. 2E, the chip bump is completed after removing second photoresist layer 11.

However, since adhesion between the barrier metal layer 5 and bump 7 is weak, heat treatment process step is performed at a temperature in the range of from 200° to 300° C. This heat treatment step is preferably carried out after completion of the electroplating process. Heat treatment helps prevent separation of a weakly adhered bump 7 from the barrier metal layer 5 during subsequent processing.

The foregoing method for manufacturing a chip bump suffers from several problems. For example, since barrier metal layer 5 is etched using bump 7 as at least a partial mask, high resolution can not be obtained. Moreover, since the photolithography step performed to etch the barrier metal layer 5 is performed after the bump is formed, the second photoresist layer 11 around the bump is relatively thick. This excessive thickness results in various process deficiencies in the exposing dosage and development of the etchant. This results in potential for shorts between adjacent bumps.

The other conventional method of manufacture illustrated in FIGS. 3 and 4 are nearly the same as that described above with respect to FIG. 1.

In the process illustrated in FIG. 3 is the same as that in FIG. 1 through the step of removing the first photoresist layer, i.e., step 100, 101, 102, and 103 are the same. After forming the bump and removing the first photoresist layer, the barrier metal layer is removed through etching using the bump as a mask without the additional steps required to form and remove the second photoresist layer 110. That is, after forming the bump according to the process of FIG. 1, the barrier metal layer is not removed using a patterned, second photoresist layer. Only the bump serves as a mask. The resulting structure is heat treated (111).

According to the method for manufacturing illustrated in FIG. 4, a first barrier metal layer overlaying a second barrier layer are deposited on the surface of a protective layer (120). A patterned photoresist layer is then formed on the upper (first) barrier metal layer (121). Then, a predetermined (exposed) portion of the first barrier metal layer is removed through an etching photolithography process step (122). Thereafter, a bump is formed using a electroplating process step and using the remaining portion of the first barrier metal layer as an electrode. The subprocess includes the steps of photoresist coating (123), photolithography (124), electroplating (125), and photoresist removal (126). The second barrier metal layer is etched using the patterned first barrier metal layer as a mask for etching (127). Finally the resulting structure is heat treated (128).

If the metals used in the first and second barrier metal layers are properly selected, corrosion by the respective etching solutions is prevented. For example, acceptable results can be obtained with the selection of barrier layer metal combinations of Ti—Pd or Ti—Cu. However, for a choice of Cr—Cu barrier metal layers, the copper may be etched by the etching solution intended for the chromium. To overcome this problem, a thick copper layer may be used or a third metal layer (e.g., a gold flash layer) can be formed over the copper layer.

Since only the first barrier metal layer is used as an electrode during the electroplating process step of forming a bump in the method illustrated in FIG. 4, variations in the height of the bump between the central and periphery portions of the wafer are easily induced.

Since the first barrier metal layer is typically formed of relatively high-resistant materials (Ti, Cr, etc.), the change in bump height becomes a problem especially in the case of large wafers.

Multiple problems are apparent in the conventional methods of manufacturing a bump, such as the methods described above with respect to FIGS. 1–4. (These methods are characterized by the absence of an additional metal layer serving as an electrode in the electroplating step). For example, a side etching of the bump occurs during the barrier metal layer etching step if a wet etching process is used. Similarly the lower barrier metal layer is damaged if dry etching process is used.

An exemplary conventional method of manufacturing a bump, wherein a metal layer conducting wire used as an electrode in the electroplating process step is illustrated in FIGS. 5A–5E. In FIGS. 5A–5E, like reference numbers refer to like elements previously described with respect to FIGS. 2A–2E.

In FIG. 5A, barrier metal layer 5 is formed as previously described. Barrier metal layer 5 is etched using a first patterned photoresist layer 12 as a mask. As shown in FIG. 5B, the first photoresist layer 12 is then removed. Thereafter, metal layer 8, used as a conducting wire in the electroplating process step, is formed on the etched surface of barrier layer 5 and the exposed portions of protective layer 4. A patterned second photoresist layer 13 is then applied, and a bump 7 is formed using second photoresist layer 13. See FIG. 5C. The metal layer conductive wiring 8 is then etched in FIG. 5D to obtain a chip bump shown in FIG. 5E.

This method of manufacturing bumps using a metal layer conducting wire requires an undue number of manufacturing steps to deposit the metal layer conducting wire. The complexity of these steps greatly increases the manufacturing costs of the finished product.

SUMMARY OF THE INVENTION

An object of the present invention considering the above-mentioned problems accompanied with the conventional manufacturing processes discussed above is to provide a method for manufacturing a chip bump having improved quality without a separate process of photolithography which is required to etch a barrier metal layer in a method not using an additional metal layer as a conducting wire.

The object of the present invention is accomplished by a method for manufacturing a chip bump comprising the steps of; forming a metal pad on a portion of a surface of a substrate, forming a barrier metal layer over the surface of the substrate such that the barrier metal layer cover the metal pad, forming a photoresist layer over the barrier metal layer, forming an opening in the photoresist layer to expose a portion of the barrier metal layer overlaying the metal pad, forming a chip bump in the opening, selectively removing the photoresist layer using the bump as a mask, such that residual portions of the photoresist layer remain, and such that portions of the barrier metal layer are exposed, etching the exposed portions of the barrier metal layer using the residual photoresist layer as a mask, and removing the residual photoresist layer.

BRIEF DESCRIPTION OF THE DRAWINGS

The above object of the present invention will become more apparent by describing in detail a preferred embodiment thereof with reference to the attached drawings in which:

FIG. 6 is a process flow chart for manufacturing a chip bump according to an embodiment of the present invention; and, FIGS. 7A to 7E illustrate a process for manufacturing a chip bump according to the embodiment of the present invention in FIG. 6.

DETAILED DESCRIPTION OF THE INVENTION

Figure 1:
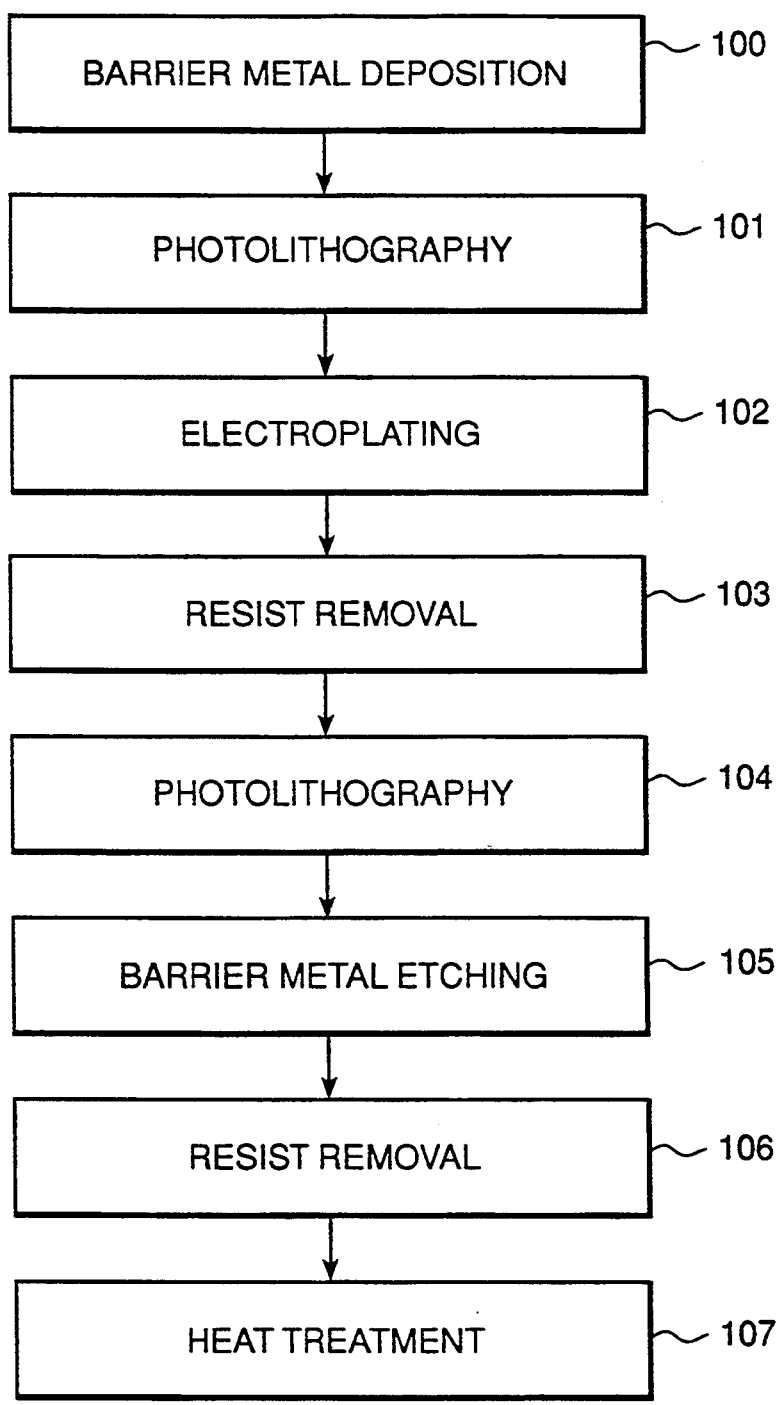
FIG. 1 is a process flow chart for a first conventional method of manufacturing a chip bump.
Figure 2A:
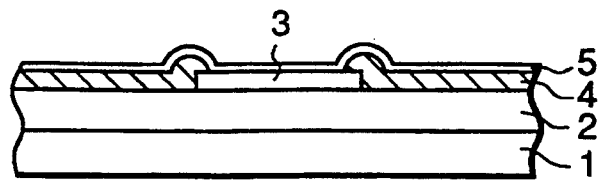
FIGS. 2A to 2E illustrate the method for manufacturing a chip bump according to the conventional method of FIG. 1.
Figure 2B:
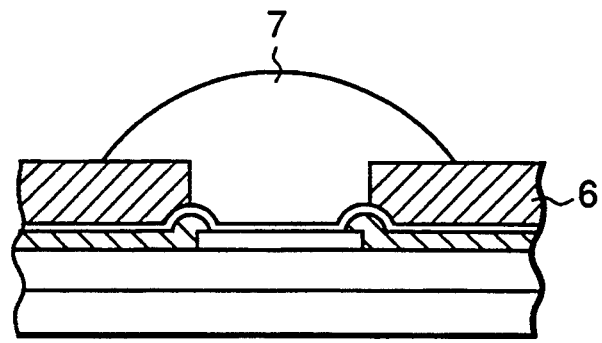
Figure 2C:
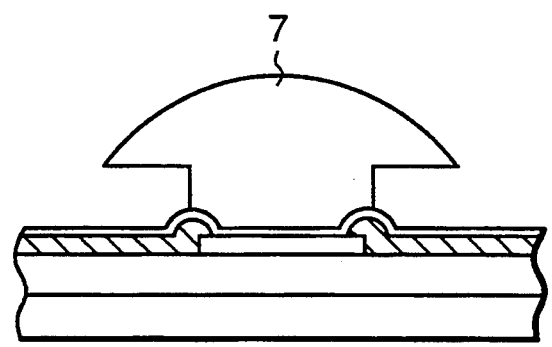
Figure 2D:
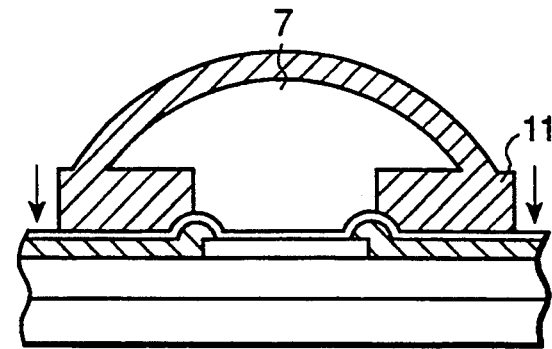
Figure 2E:
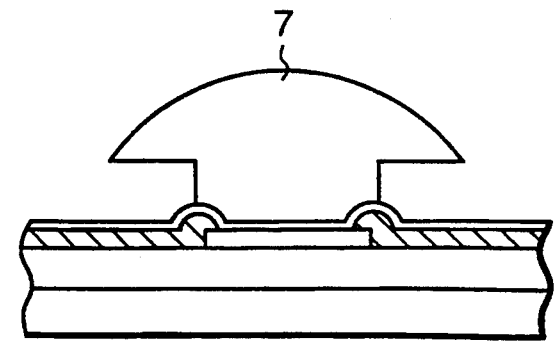
Figure 3:
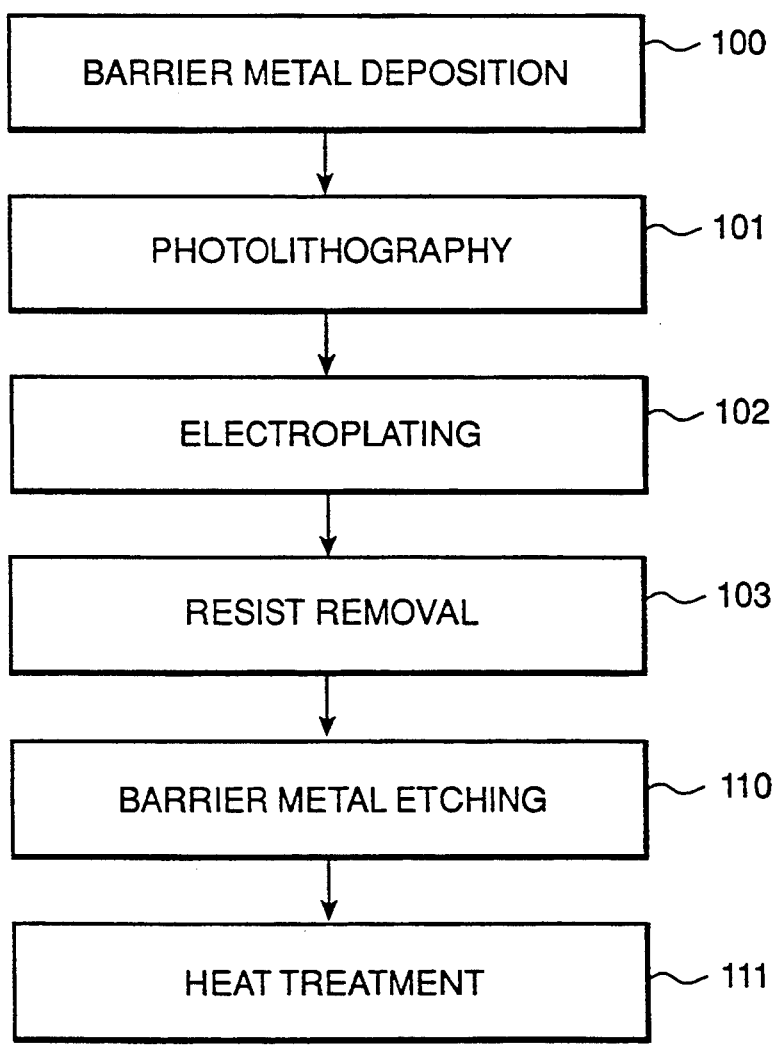
FIG. 3 is a process flow chart for another conventional method of manufacturing a chip bump.
Figure 4:
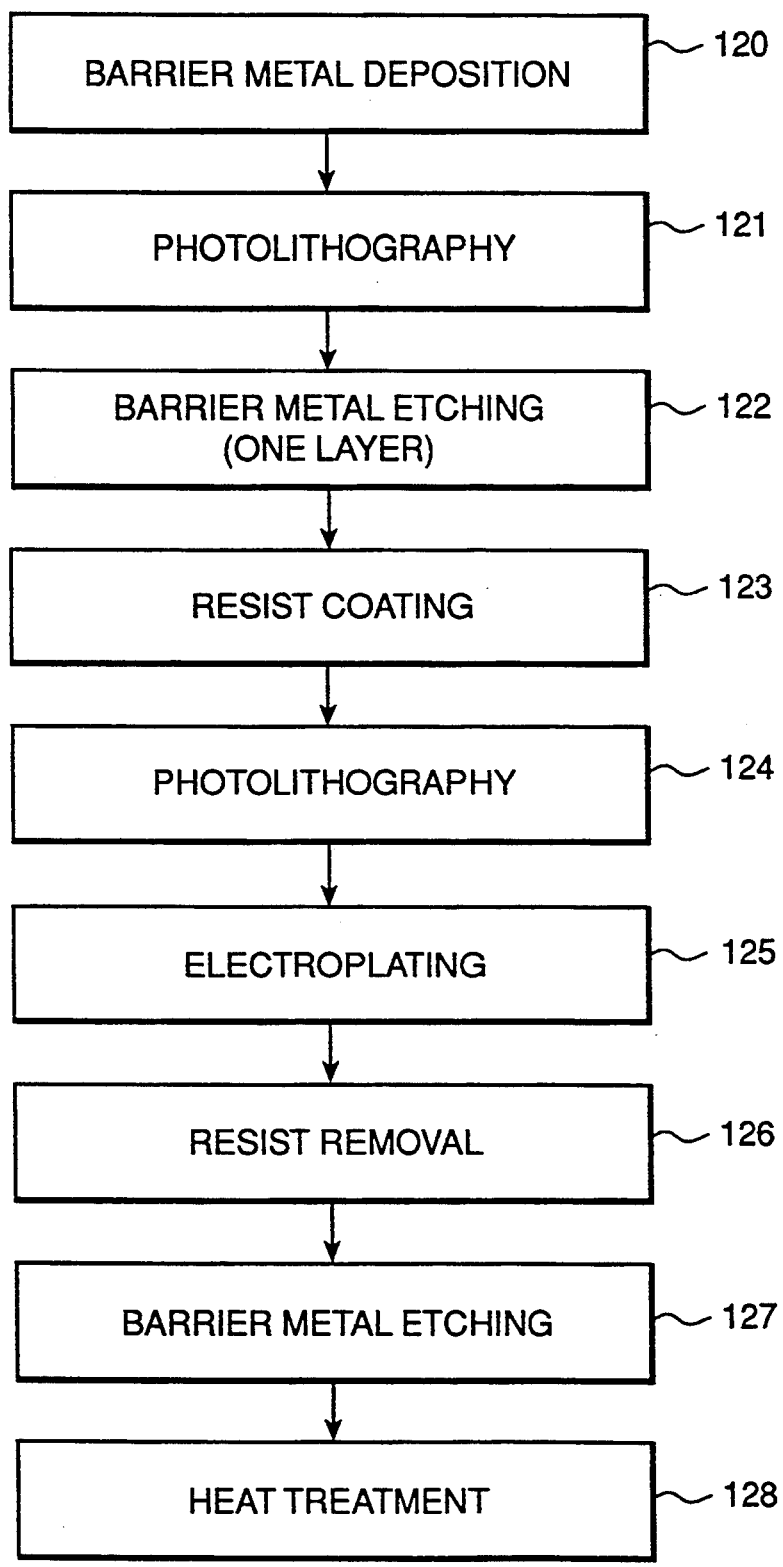
FIG. 4 is a process flow chart for yet another conventional method of manufacturing a chip bump.
Figure 5A:
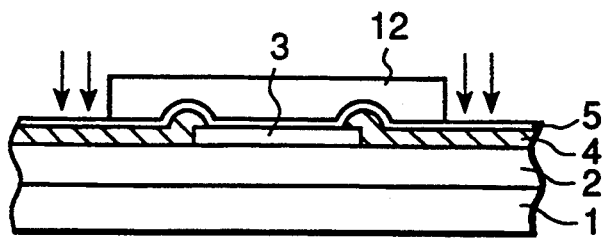
FIGS. 5A to 5E illustrate a process for manufacturing a chip bump when employing conducting wire according to still another conventional method.
Figure 5B:
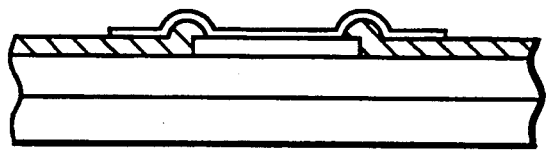
Figure 5C:
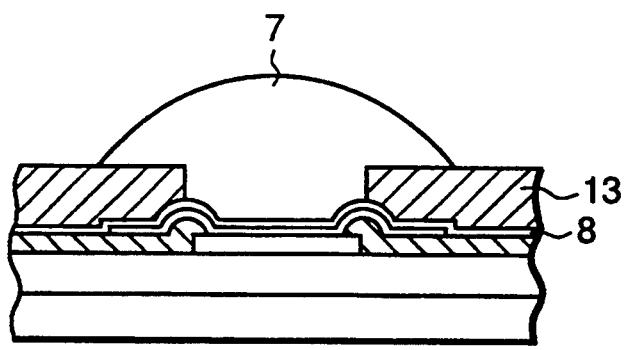
Figure 5D:
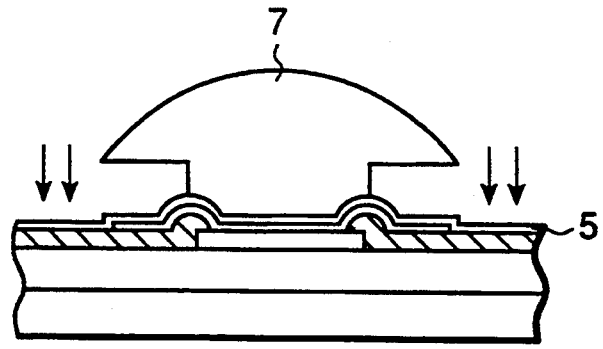
Figure 5E:
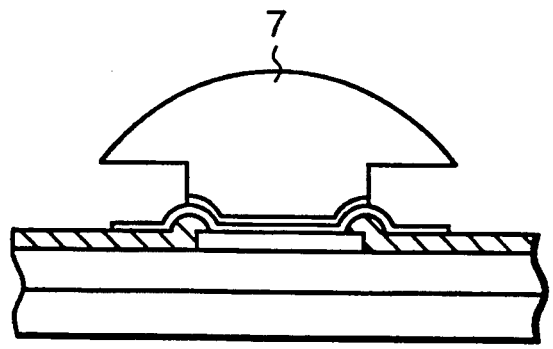

In the present invention, a barrier metal layer is etched using a portion of a residual portion of the photoresist layer which remains on the surface of the barrier metal layer following the formation of the bump and serves as a mask. Thus, a method of manufacture according to the present invention is relatively simply and the overall cost of manufacturing the semiconductor device is reduced.

In the present invention, the thickness of the bump is preferably greater than that of the barrier metal layer by a factor of several tens. Thus, the thickness of the bump will not materially vary across the bump when the bump is etched during the etching process of the barrier metal. A deposition of copper, solder, gold or other junction metals may be used to form the bump.

The photoresist layer under the bump may be either a positive-type or a negative-type photoresist compound. The type, thickness and length of the photoresist layer under the bump can be freely adjusted within the range of preventing side etching by adjusting the size of the bump. However, the thickness of the photoresist under the bump is preferably in the range of from 2 to 100 $\mu$m.

The process of selectively leaving a residual portion of the photoresist layer may be performed using the bump as a mask, or by using a mask or second photoresist layer to shield the bump. The photoresist layer may be etched by a wet etching process, dry etching process, wet developing process, dry developing process, etc.

As for the barrier metal layer, at least one material selected from the group consisting of Ti, TiW, TiWN, Ni, TiN, Pd, W, Cu, Cr, Au and alloys thereof is preferably used. The barrier metal layer may be etched or removed using either a wet etching process or dry etching process.

The barrier metal layer may be a composite that is formed of multiple layers. In a case where the composite barrier metal layer comprises two barrier metal layers, the composite barrier metal layer is preferably etched by first etching an upper (or first) barrier metal layer, then removing the remaining portion of the photoresist layer under the bump, and etching a lower (or second) barrier metal layer using the upper barrier metal layer as a mask.

The step of leaving a residual portion of the photoresist layer under a peripheral portion of the bump is preferably applied to a mushroom shaped bump in which the lower (stem) part of the bump is recessed from the top (head) part. The present invention will be illustrated in FIGS. 6 and 7A–7E.

FIG. 6 is a process flow chart for manufacturing a chip bump according to an embodiment of the present invention. The present invention comprises the steps of depositing a barrier metal layer (200) on a prepared substrate, forming a bump over the barrier metal layer by means of a patterned photoresist layer using photolithography (201) and electroplating (202), selectively removing the photoresist layer to leave a residual portion and expose portions of the barrier metal layer (203), removing the exposed portions of the barrier metal layer (204), and removing the residual portion of the photoresist layer (205).

Figure 7A:
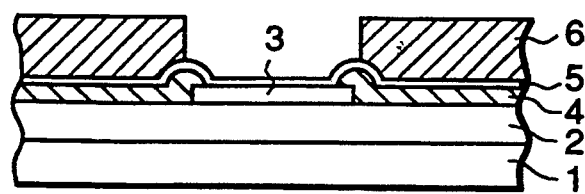

FIGS. 7A through 7E further illustrate the process shown in FIG. 6. In FIG. 7A, a silicon layer 1 and silicon oxide layer 2 are formed according to the conventional method. A metal layer, preferably aluminum, is patterned using photolithography and etching processes to form a metal pad 3 over silicon oxide layer 2. A protective layer 4 is formed by deactivation leaving the metal pad at least partially opened or exposed. Next, a photoresist layer 6 is formed and patterned over the barrier metal layer 5. The patterned photoresist layer 6 creates a opening over the portion of barrier metal layer overlaying metal pad 3. A bump will be formed in this opening.

Figure 7B:
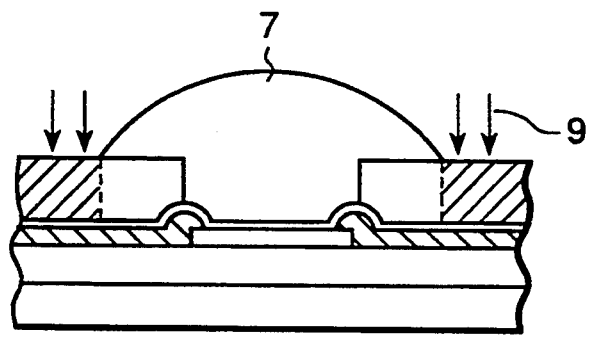
Figure 7C:
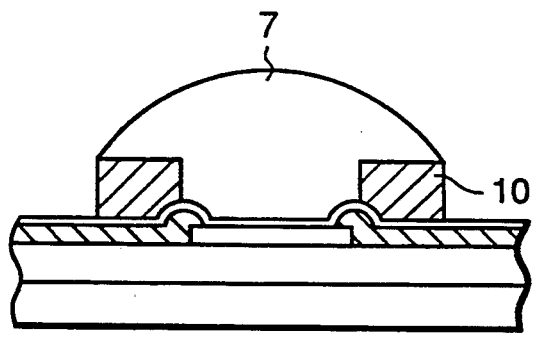
Figure 7D:
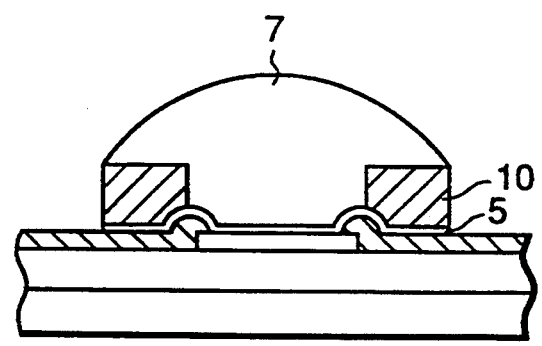
Figure 7E:
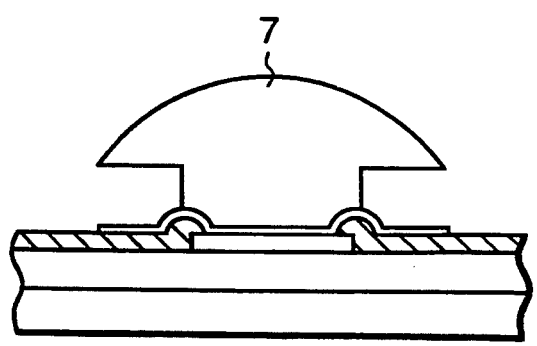

In FIG. 7B, a mushroom shaped bump 7 is formed by an electroplating process step, by an exposure process step 9 using the bump as a mask, and by a developing step. Referring to FIG. 7C, the foregoing method steps leave not only the mushroom shaped bump having its head part overlaying the upper plane of photoresist layer 6, but also a stem part in electrical contact with barrier metal layer 5 and metal pad 3. The foregoing method steps also leave a photoresist layer portion 10 under the peripheral portions of the bump, i.e., under the portion of the head part extending beyond the stem part.

After wet or dry etching the exposed portions of barrier metal layer 5 using bump 7 and residual photoresist layer portion 10, the residual photoresist layer portion 10 is removed through a wet etching or dry etching process step. Wet development or dry development will yield a chip bump according to an embodiment of the present invention. See FIGS. 7D and 7E.

Several preferred embodiments of the foregoing method will be described in detail.

EXAMPLE 1

A 4000 Å-thick $SiO_2$ layer was formed on a silicon wafer and then aluminum is deposited and patterned through photolithography and an etching process. A protection layer is formed over the $SiO_2$ layer and aluminum layer through passivation with $Si_3N_4$. Then, a portion of the patterned aluminum layer is exposed and a composite barrier metal layer consisting of a 2000 Å-thick TiW lower layer and a 1 μm-thick Cu upper layer is formed by means of sputtering. A photoresist layer having a thickness of 5 μm is formed by using PAR-900 photoresist manufactured by the TOK Company. Then, a pad cavity is formed by patterning the photoresist layer. The depth of the pad cavity, which will form the length of the stem portion of the mushroom bump, as well as the width of the head portion of the mushroom range from several micrometers to several tens of micrometers. The bump is formed from copper. After manufacturing the bump, the entire wafer is exposed without a mask to an energy field of 300 $mJ/cm^2$ by means of an aligner made by the Perkin Elmer Company, and thereby developed. A photoresist portion under the peripheral portion of the bump is selectively left throughout this process. Using the remaining photoresist layer portion as a mask, the upper barrier metal (Cu) was etched using $FeCl_3$ for three minutes, while the lower barrier metal (TiW) was etched using $H_2O_2$ at 50° C. for three and a half minutes, to obtain the chip bump according to the present invention.

EXAMPLE 2

This example was carried out according to the same manner described in Example 1, except that a Cr/Cu combination was used as the composite barrier metal layer. The upper barrier metal (the copper layer) was etched, and then the photoresist layer under the bump was removed. The lower barrier metal (the chromium layer) was etched using the upper barrier metal layer as a mask, to obtain the chip bump according to the present invention.

According to the method of the present invention as described above, the problem of side-etching of the bump during wet etching of barrier metal layer does not occur since the photoresist layer under the bump acts as a mask. Therefore, a high-resolution pattern can be obtained using either a wet or dry etching process. In the conventional method in which metal layer conducting wire is employed, the barrier metal is etched before electroplating. However, in the present invention, the barrier metal layer is etched after electroplating. Moreover, since unnecessary processes such as deposition of metal for conducting wire for etching barrier metal, photolithography, etc. can be omitted, the overall method of manufacture is simplified, and cost of the semiconductor device can be reduced.

The foregoing examples and the preferred embodiment of the present invention are given by way of explanation. Routine design changes, modifications, and variations may be made to the above teaching without removing the results from the scope of the present invention as defined by the following claims.

What is claimed is:

1. A method for manufacturing a bump on a semiconductor device, comprising the steps of:
    forming a metal pad on a surface of a substrate;
    forming a barrier metal layer over the surface of the substrate such that the barrier metal layer covers the metal pad;
    forming a photoresist layer over the barrier metal layer;
    forming an opening in the photoresist layer to expose a portion of the barrier metal layer overlaying the metal pad;
    forming a chip bump in the opening;
    selectively removing the photoresist layer using the bump as a mask, such that residual portions of the photoresist layer remain, and such that portions of the barrier metal layer are exposed;
    etching the exposed portions of the barrier metal layer using the residual photoresist layer as a mask; and
    removing the residual photoresist layer.

2. A method as claimed in claim 1, wherein the barrier metal layer is formed having a first thickness measured in a direction orthogonal to the surface of the substrate, and wherein the bump is formed having a second thickness several ten times greater the first thickness.

3. A method as claimed in claim 1, wherein the step of selectively removing the photoresist layer is performed using a mask to shield the bump.

4. A method as claimed in claim 1, wherein the barrier metal layer is a composite comprising multiple layers.

5. A method as claimed in claims 4, wherein the multiple layers comprise a first barrier metal layer and a second barrier metal layer.

6. A method as claimed in claim 5, wherein the step of etching the composite barrier metal layer comprises the substeps of:
   etching the first barrier metal layer;
   removing the residual photoresist layer; and
   etching the second barrier metal layer using the first barrier metal layer as a mask.

7. A method as claimed in claim 1, wherein the photoresist layer is formed having a thickness in the range of from 2 to 100 μm.

8. A method as claimed in claim 1, wherein the bump is formed from a deposition of one of gold, silver, solder, and copper.

9. A method as claimed in claim 1, where the barrier metal layer is formed of one of Ti, TiW, TiWN, Ni, TiN, Pd, W, Cu, Cr, Au, and alloys of Ti, TiW, TiWN, Ni, TiN, Pd, W, Cu, Cr, and Au.

10. A method as claimed in claim 5, wherein the first barrier metal layer is formed from one of Ti, and Cr, and the second barrier metal layer is formed from one of Pd, and Cu.

11. A method as claimed in claim 1, wherein the step of forming a metal pad comprises the substeps of:
   forming a metal layer over the surface of the substrate;
   patterning the metal layer to form the metal pad.

12. A method as claimed in claim 11, wherein the metal layer is aluminum.

13. A method as claimed in claim 1, wherein the bump formed in the opening has a mushroom shape having a stem part filling the opening, and a head part extending beyond the stem portion and overlaying a portion of the photoresist layer,
   wherein the portion of photoresist layer overlaid by the head part is the remaining residual portion of the photoresist layer when the photoresist layer is selectively removed.

14. A method for manufacturing a bump on a semiconductor device, comprising the steps of:
   forming a metal pad on a surface of a substrate;
   forming a barrier metal layer over the surface such that the barrier metal layer covers the metal pad;
   forming a first photoresist layer over the barrier metal layer;
   forming an opening in the photoresist layer to expose a portion of the barrier metal layer overlaying the metal pad;
   forming a chip bump in the opening;
   forming a mask over the bump;
   selectively removing the photoresist layer using the mask, such that a residual portion of the photoresist layer remains, and such that portions of the barrier metal layer are exposed;
   etching the exposed portions of the barrier metal layer using the residual photoresist layer as a mask; and
   removing the residual photoresist layer.

* * * * *